(12) United States Patent
Schneider

(10) Patent No.: US 7,538,697 B1
(45) Date of Patent: May 26, 2009

(54) HEURISTIC MODELING OF ADAPTIVE COMPRESSION ESCAPE SEQUENCE

(75) Inventor: James P. Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 0 days.

(21) Appl. No.: 12/072,879

(22) Filed: Feb. 27, 2008

(51) Int. Cl.
*H03M 7/34* (2006.01)
*H03M 7/38* (2006.01)

(52) U.S. Cl. .......................... 341/51; 341/50
(58) Field of Classification Search ............ 341/50, 341/51, 65, 67, 107
See application file for complete search history.

(56) References Cited

U.S. PATENT DOCUMENTS

| | | | | |
|---|---|---|---|---|
| 5,729,223 A | * | 3/1998 | Trissel | 341/51 |
| 5,796,356 A | * | 8/1998 | Okada et al. | 341/51 |
| 5,831,559 A | * | 11/1998 | Agarwal et al. | 341/106 |
| 5,844,508 A | * | 12/1998 | Murashita et al. | 341/51 |
| 5,861,827 A | * | 1/1999 | Welch et al. | 341/51 |
| RE37,507 E | * | 1/2002 | Jung | 341/63 |
| 6,628,215 B2 | * | 9/2003 | Talwar et al. | 341/107 |
| 6,768,818 B2 | * | 7/2004 | Friederich et al. | 382/233 |
| 7,289,047 B2 | * | 10/2007 | Nagori | 341/67 |

* cited by examiner

*Primary Examiner*—Peguy JeanPierre
(74) *Attorney, Agent, or Firm*—Blakely, Sokoloff, Taylor & Zafman LLP

(57) ABSTRACT

Techniques for improving encoding and decoding data are described herein. According to one embodiment, buffering an initial chunk of an input stream. A number of escape tokens that would be emitted at each stage of encoding at least buffered initial chunk is determined. For each stage, a base value and a step value for the escape token are determined using a heuristic modeling function in view of the determined number of escape tokens such that a number of bits required to encode the input stream is minimized. The input stream are encoded using an adaptive context model having a context for each stage to generate an output stream, wherein each context is initialized with the corresponding base value and step value generated from the heuristic modeling function, where the output stream includes the base value and step value for each stage.

18 Claims, 9 Drawing Sheets

```
struct Context_Structure
{
    void  *Parent_Pointer;
    void  *Child_Pointer[256];
    int   Count_Value[257];
}
```

FIG. 3

HEURISTIC MODELING OF ADAPTIVE COMPRESSION ESCAPE SEQUENCE

TECHNICAL FIELD

The present invention relates generally to data compression. More particularly, this invention relates to heuristic modeling of adaptive compression escape sequence.

BACKGROUND

Traditional entropy encoding compression algorithms (such as Huffman coding, adaptive Huffman coding or arithmetic coding) depend on having a statistical model of the input stream they are compressing. The more accurately the model represents the actual statistical properties of symbols in the input stream, the better the algorithm is able to compress the stream. Loosely speaking, the model is used to make a prediction about what input symbol will come next in the input stream. For example, if the input stream is English-language text, the model would assign a higher probability to the letter 'e' than to the letter 'Q' (usually). This corresponds physically to making the 'e' segment of the pin longer than the 'Q' segment.

The probability model can be static (i.e., unchanging for the duration of a compression process) or adaptive (i.e., evolving as the compressor processes the input data stream). The probability model can also take into account one or more of the most recently encountered input symbols to take advantage of local correlations. For example, in English text, encountering a letter 'Q' or 'q' in the input stream makes it more likely that the next character will be 'u'.

An adaptive model typically works by matching the current input symbol against its prediction context, and if it finds the current input symbol in its context, generating a code representing the particular probability range that the input symbol represents. For example, if the current input symbol is 'e' and the model predicts that the probability of 'e' is in the range 0.13 to 0.47, then the compressor would generate an output code representing that probability range. This corresponds, in the physical example, to adjusting the mark to fall within the noted range of the current sub-segment of the pin. Once the symbol is encoded, the compressor updates the probability model. This "code and update" cycle is repeated until there are no more input symbols to compress.

When the compressor encounters a new symbol for which its model has no prediction, it must do something else. What it does is encode a special "escape" symbol to signal to the decompressor that the next symbol is a literal value. This escape-and-literal output has two problems: first, since the literal value will be sent as a whole number of bits (e.g., eight bits), compression algorithms that can send symbols in fractional bits will lose a small amount of compression efficiency when a fractional bit is rounded up to a whole-bit boundary. Second, the fact that these escaped literal symbols failed to match the current probability model provides some residual information that could be used to compress the literals themselves. This compression opportunity is wasted if the literals are distributed throughout the compressed data stream wherever the unmatched symbols happen to appear. Compression algorithm modifications to plug these efficiency "leaks" may be able to improve overall compression performance.

BRIEF DESCRIPTION OF THE DRAWINGS

The present invention is illustrated by way of example and not limitation in the figures of the accompanying drawings in which like references indicate similar elements.

FIGS. 3-4 are data structures which may be used for encoding and decoding processes according to one embodiment of the invention.

DETAILED DESCRIPTION

In the following description, numerous details are set forth to provide a more thorough explanation of the embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Figure 1:
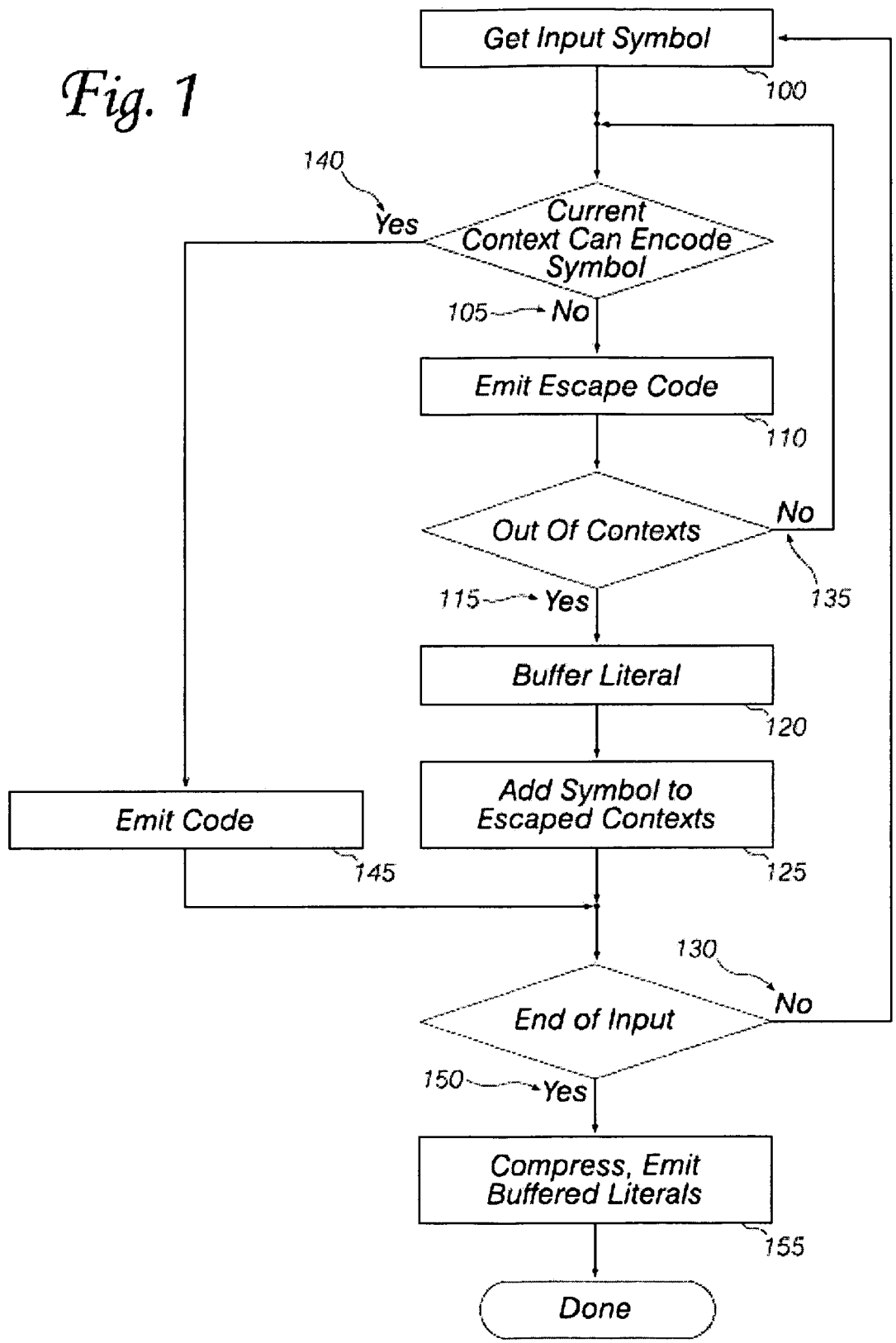
FIG. 1 shows an overview of an adaptive coding compression process according to an embodiment of the invention.
Figure 2:
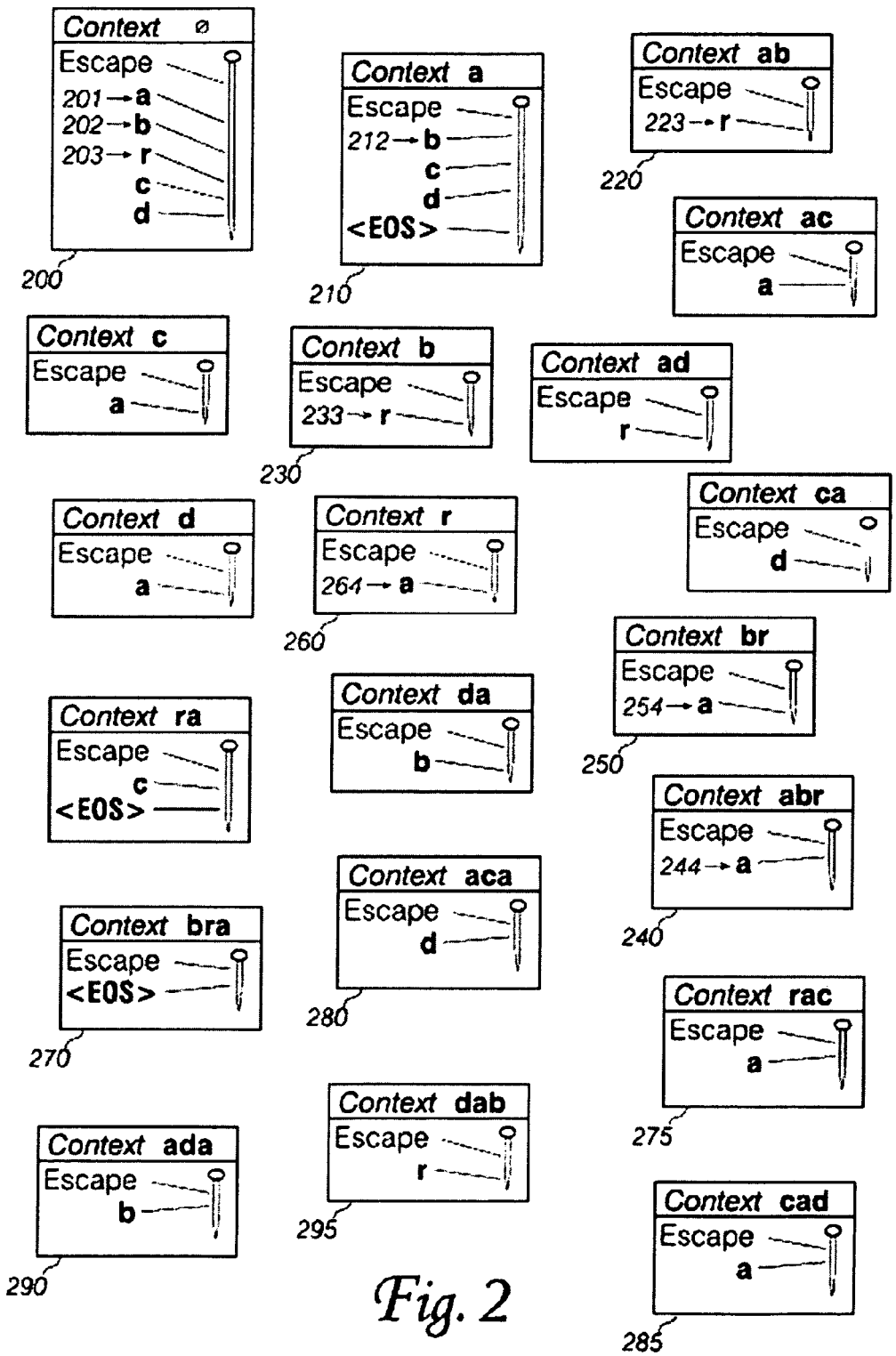
FIG. 2 shows the three-symbol contexts that are created as an embodiment of the invention compresses the string "abracadabra".

FIG. 1 is a flow diagram illustrating operations of an adaptive entropy coding compressor according to one embodiment of the invention. The following explanation will track the compressor through the flow chart as it processes an input string, "abracadabra". Compression can be thought of as building a model of the input data and picking a minimal set of clues about the model to send to a decompressor, so that the decompressor can replicate the model and reproduce the input string. FIG. 2 shows "contexts" of the model according to certain embodiments of the invention. Each context corresponds to symbols the compressor has recently encoded (or symbols the decompressor has recently recovered). The compressor examined in this example uses three-symbol contexts (i.e., each context corresponds to the up to three most-recently-encountered input symbols). Shorter contexts (two-character, one-character, and no-character contexts) also appear in the model, which may be a parent of a longer context (e.g., next order context) in a tree structure. All the contexts together make up a probability model that, in some sense, represents estimates of the likelihood that a particular symbol will be seen at a certain point in the input.

The information in a context can be thought of as a map to sub-segments of a part of a pin. A fully-populated context would have entries giving the length of the pin-segment allocated to each corresponding input symbol. However, since this is an adaptive compressor, each context starts out empty (rather than divided into twenty-six segments for each letter or 256 segments for each possible eight-bit symbol). As input symbols are encountered, contexts add segments and/or adjust the boundaries between segments so that the context can efficiently encode the input.

According to one embodiment, as an example of an implementation, each context may be defined as a data structure as shown in FIG. 3. Referring to FIG. 3, each context includes a parent pointer pointing to a parent context of the current context (e.g., a shorter context). The root context would have the parent pointer as NULL or zero since it does not have any parent. Each context may also include one or more child contexts (e.g., longer contexts or next order contexts), where number of the child contexts depends on a specific application or configuration. In this example, it is assumed that there are 256 different symbols plus an escape symbol. The context structure further includes an array of count value each corresponding to a symbol to be encoded or decoded. The count value may be used to represent number of the corresponding symbol has been processed. In one embodiment, the last entry of the count array may be used to store the number of escape symbol or code has been processed. Note that the data structure as shown in FIG. 3 is described for purposes of illustration only. Other formats or configurations may also exist.

Although all of the contexts, and the symbols each can encode, are shown in FIG. 2, they accumulate over time (as described below). The model starts out empty, with the initial context 200 (e.g., context " " as a root context) able to encode only an escape symbol. The escape symbol is distinct from the 256 possible symbols that could be present in a stream of eight-bit characters.

The compressor retrieves the first input symbol (block 100), a. The current context, 200, cannot (yet) encode a (block 105) so the compressor emits an escape token (block 110) and moves to a shorter context. Since context 200 is the shortest (zero-character) context, the compressor is out of contexts (block 115). It buffers the literal a (120) and adds a to each of the escaped contexts (block 125). (Element 201 indicates the a added to context 200.) The compressor has not reached the end of its input (block 130), so it loops back to get the next input symbol (block 100).

Figure 4:
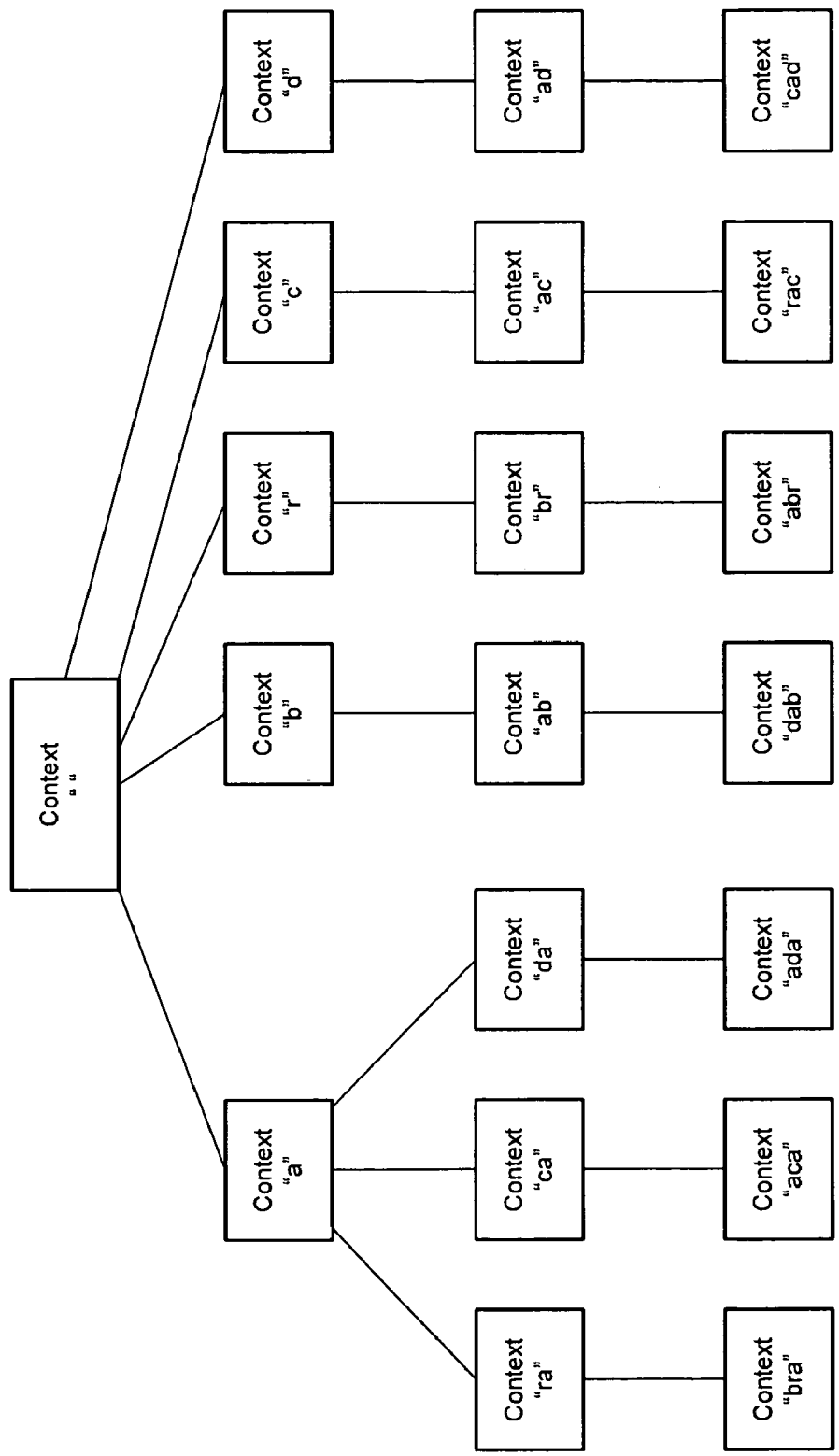

In practice, a child context is created having a parent pointer pointing to context 200 while context 200 has a child pointer pointing to the newly created child context, forming a tree structure similar to the one as shown in FIG. 4. In this example, context 210 (e.g., context "a") is created from context 200, where context "a" includes a parent pointer pointing to context 200 while context 200 includes a child pointer pointing to context "a", as shown in FIG. 4. At this point, context "a" can only encode an escape symbol, also referred to as "<Esc>" symbol, which may be considered implicit <Esc> symbol.

The next symbol is b, and the compressor starts with the last context corresponding to the last symbol which is context "a" (block 210). Since context 210 cannot (yet) encode b (block 105), the compressor emits an escape token (block 110) and moves (e.g., escapes) to a shorter context, which is context 200 (e.g., the parent context of context "a") as shown in FIG. 4. The next-shortest context is 200, so the compressor is not out of contexts (block 135) and loops back to consider context 200. Context 200 is also unable to encode b (block 105) (it can currently encode only escape and a), so the compressor emits another escape token (block 110) and moves to a shorter context. Again, context 200 is the shortest context, so the compressor is out of contexts (block 115). The literal, b, is buffered and also added to each escaped context (blocks 202, 212). So far, the compressor has emitted three escapes and buffered two literals. Only the escape from context 200 on input symbol b required any bits to encode; all the other escapes were from contexts that could only encode the escape.

The next symbol is r and the starting context is ab (block 220), which corresponds to the last context with respect to "r" (e.g., for sequence of "abr" the last context having up to three symbols is context "ab"). Context 220 cannot encode r (block 105), so the compressor emits an escape token (block 110) and moves to shorter context b (block 230) (e.g., parent context of context "b" as shown in FIG. 4). Context 230 also cannot encode r (block 105), so the compressor emits another escape token (block 110) and moves to shorter context 200. Context 200 cannot encode r (block 105), so the compressor emits another escape token (block 110) but is out of contexts (block 115), which in turns creates a child context "r", etc. Literal r is buffered and added to contexts 200, 220 and 230 (see 203, 223 and 233). The end of the input has still not been reached (block 130), so the compressor loops back yet again.

For the next input symbol, a, the compressor starts at context 240 and escapes through 240, 250 and 260 (adding coding 244, 254 and 264) before discovering that context 200 can encode the input symbol (block 140). Therefore, the compressor emits the appropriate code (block 145) and loops back again.

The following table summarizes the activity of the compressor working through the input string. "<EOS>" signifies the end of the string. "Escapes" is the number of contexts escaped from before a context that can encode the current symbol is found, or a literal must be buffered. "Coding Context" identifies the context that was able to encode a symbol, while "Literal" indicates that the compressor buffered a literal and updated one or more escaped-from contexts.

TABLE 1

| Symbol | Start Context | Escapes | Coding Context | Literal |
| --- | --- | --- | --- | --- |
| a | 200 Ø | 1 | | a |
| b | 210 a | 2 | | b |
| r | 220 ab | 3 | | r |
| a | 240 abr | 3 | 200 | |
| c | 270 bra | 4 | | c |
| a | 275 rac | 3 | 200 | |
| d | 280 aca | 4 | | d |
| a | 285 cad | 3 | 200 | |
| b | 290 ada | 3 | 200 | |
| r | 295 dab | 3 | 200 | |
| a | 240 abr | | 240 | |
| <EOS> | 270 bra | 4 | | <EOS> |

After escaping from context 270 and buffering the end-of-stream (EOS) literal, the compressor determines that the end of input has been reached (block 150). Now, it compresses the buffered literals and emits them in a discernible position relative to the encoded data bits (for example, at the beginning of the encoded stream, at the end of the stream, or at a block boundary in the stream). Concerns affecting the placement of the buffered, compressed literals are discussed below.

Figure 5:
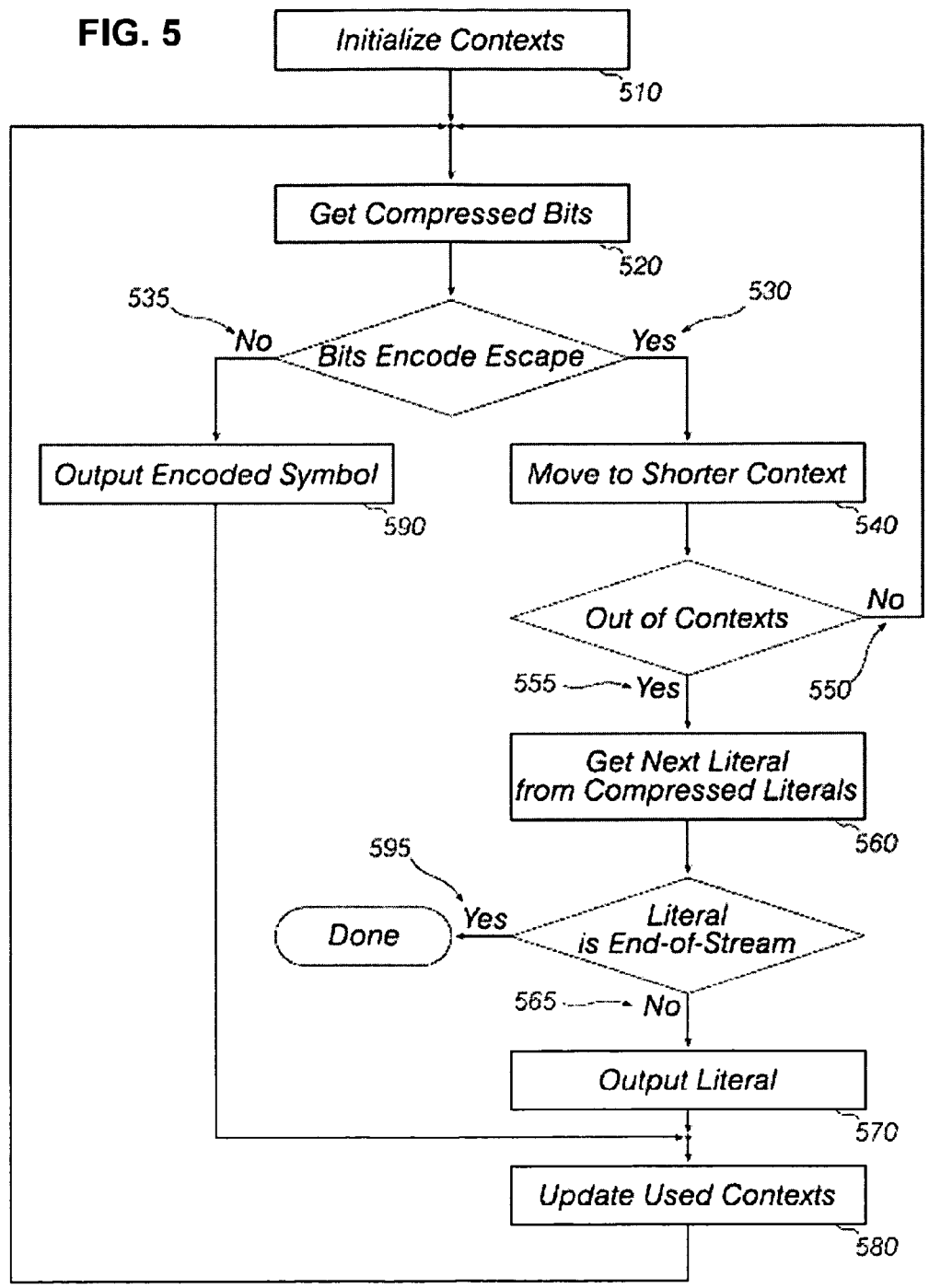
FIG. 5 is a flow diagram outlining decompression according to an embodiment of the invention.

FIG. 5 is a flow diagram outlining the operations of an entropy coding data decompressor according to an embodiment of the invention. Referring to FIG. 5, the decompressor initializes its context model identically to the compressor's initialized model (block 510). Recall that despite the large number of contexts (shown in FIG. 2) that exist after compressing an input stream, the compressor and decompressor start with just one state, 200, that can encode just one symbol, escape.

Next, the decompressor gets some compressed bits from the compressed data stream. The number of compressed bits necessary to decide what to do next varies from time to time, depending on the state of the decompression context. For example, when decompression has just started and context 200 can only encode escape, no bits are required—the decompressor knows that the compressor must have emitted an escape, because that is the only thing it could emit. Consequently, the escape is encoded in zero bits.

Since the first compressed bits encode escape (block 530), the decompressor moves to a shorter context (block 540). However, since context 200 is already the shortest context, the decompressor is out of contexts (block 555) and requires a literal. It obtains the next literal from the literal decompressor (block 560), checks to ensure that it has not reached the end-of-stream (block 565) and outputs the literal as the reconstituted data (block 570). Referring to Table 1, it is clear that the first compressed literal was a, so that symbol is output.

Any contexts used (e.g., escaped from) are updated (block 580), and the decompressor loops back to get more compressed bits (block 520). (Again, no compressed bits have been used yet, because no existing context could encode anything except Escape.)

Now, the decompressor is in context 210, because it has just produced the symbol a. Context 210 is unable to encode any symbol except escape, so the decompressor again consumes zero bits to determine that the next encoded symbol is escape (block 530). Now, the decompressor moves to the next-shorter context (block 540), which is context 200. It is not out of contexts (block 550), so it loops back to get more compressed bits (block 520).

Context 200 currently encodes escape and a, so some information (at least a portion of a compressed bit) is required to decide which. This compressed bit encodes another escape (block 530). This is the third escape mentioned above. The decompressor moves to a shorter context (block 540) and runs out of contexts (555), so it gets the next literal from the compressed literals (block 560), notes that it is not end-of-stream (block 565), and outputs it (block 570). Recall that the second literal produced during compression was b. The contexts escaped from (210, 200) are updated (block 580) and the decompressor loops back again.

This process continues until the characters abr have been recovered and output. The decompressor is in state 240 and gets some more compressed bits (block 520). States 240, 250 and 260 only encode escapes, so no bits are consumed as the decompressor escapes to shorter contexts. When it reaches context 240, it discovers that the next compressed bits encode a (block 535), so it outputs this symbol (block 590), updates the appropriate contexts (580) and loops back to process more compressed bits.

The decompressor continues working through the compressed bits, extracting literals as necessary from the compressed literals block, until there are no more compressed bits to examine. At this point, the original input symbol sequence has been reconstituted and emitted.

Note that the decompression process requires literals from the compressed block fairly early in its operations (in fact, the very first thing it does is infer an escape from zero compressed bits, extract a compressed literal and output it). Thus, it is important for the decompressor to have access to the compressed literals as soon as possible. If the decompressor has access to the entire compressed data stream, then it can use the dual-file-pointer method depicted to access the literals as necessary. However, if the decompressor is receiving the compressed data stream from a non-seekable source, it must buffer the data until it can determine where the compressed literals are. Further detailed information regarding the techniques set forth above can be found in a co-pending U.S. patent application Ser. No. 11/948,954, filed Nov. 30, 2007, which is incorporated by reference herein.

As described above, at the beginning of encoding, a substantial amount of escape tokens are emitted and thus, more bits may be needed to encode these escape tokens. However, if the escape token count starts at an optimal number, the number of bits required to encode the escape tokens may be substantially reduced. According to one embodiment, a heuristic model is utilized to predict an optimum escape initial count as well as step count (e.g., a step size for increment or decrement) based on an initial chunk of symbols of an input stream having a sequence of symbols or literals. Once the optimum initial escape count and the step count are determined, a context when initially created is initialized using the optimum initial escape count and step count. As a result, the number of bits required to encode the input stream may be greatly reduced.

Every entropy encoder strives to reduce the number of bits used to represent a block of data by trying to model the probabilities of the data items being coded (typically, this is bytes, but it can be bits or words). The more accurate this model, the fewer bits are needed for the encoding.

The statistical model used in entropy coding can come in one of two broad types: a static model, where the global probabilities of all of the symbols to be encoded are calculated once, and the probability table is sent as part of the compressed data stream, or an adaptive model, where the model starts with very little statistical information, and adds information as symbols from the input stream are processed. One commonly used adaptive model is called "prediction by partial matching" (PPM). This model counts the occurrence of each symbol in the contexts in which it occurs.

One problem with PPM coding models is how to account for codes that do not occur in the context driving your coding. The escapes are used because including every possible symbol in every context leads to a poor performance (including possible data expansion).

The problem with escapes is that if they are treated like regular symbols, their implied probability will increase as they actually become a good deal less probable. According to one embodiment, prior to encoding the symbols using the techniques set forth above, a prefix of the input stream, such as, for example, the first 64K of symbols, is utilized to determine what the appropriate counts are for the escape at each stage of the model evolution to minimize the number of bits.

An entropy encoder has a theoretical minimum number of bits equal to the sum of the base-2 logarithm of the reciprocal of the probability of each individual symbol. In other words, if the symbols $s_0, s_1, \ldots s_i, \ldots$ (representing a sequence to be compressed) had probabilities $p_0, p_1, \ldots p_i, \ldots$ of occurring according to the statistical model being used, the attached entropy coder will produce at least $(\ln(1/p_0)+\ln(1/p_1)+ \ldots +\ln(1/p_i)+ \ldots)/\ln 2$ bits of output. For a bit-granular coding method (such as Huffman coding), the theoretical minimum number of bits is actually $\text{ceil}(\ln(1/p_0)/\ln 2)+\text{ceil}(\ln(1/p_1)/\ln 2)+ \ldots$ (ceil(x) is the integer ceiling function—the smallest integer not less than its argument). This sum is minimized by maximizing the probabilities. An embodiment of the invention is to use a chunk of the input stream to determine how to do it.

For the purpose of illustration, the same example of sequence "abracadabra" is utilized herein. With an order-0 model, the code stream would be <escape>-<escape>-<escape>-"a"-<escape>-"a"-<escape>-"a"-"b"-"r"-"a". Assuming a pseudo-count function for the escape symbol f(x), the table would evolve as shown in FIG. 6.

Figure 6:
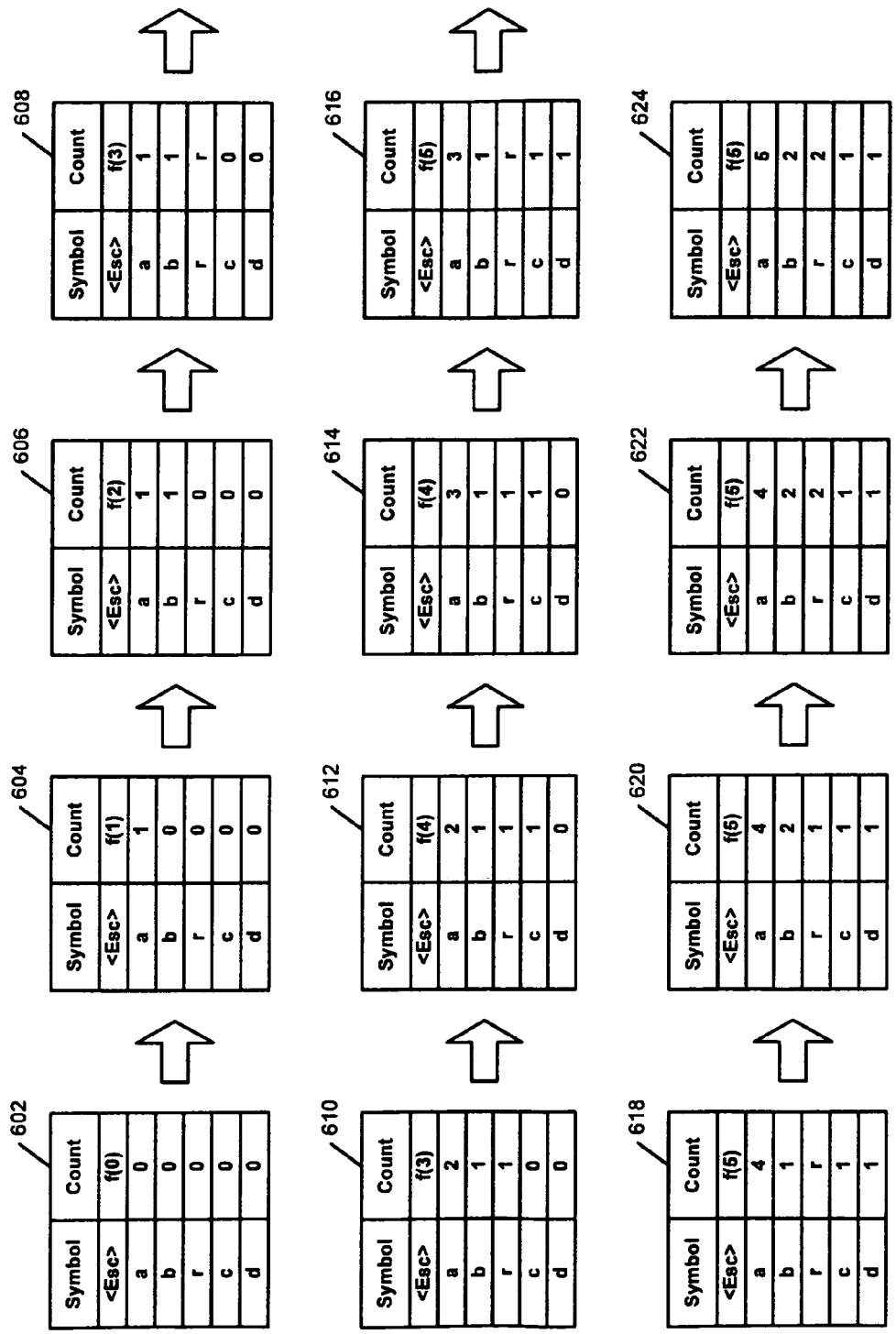
FIG. 6 is a data diagram illustrating a heuristic statistics of adaptive compression escape sequence according to one embodiment of the invention.

Referring to FIG. 6, the table starts with table 602. When "a" is encoded, the table becomes table 604 and when "b" is encoded, the table becomes table 606. Similarly, when "racadabra" are encoded, the tables are updated from table 608 to 614 as shown in FIG. 6. Going through all of these tables as shown in FIG. 6, we see that the predictions made by the model have the following values:

*a*bracadabra–f(0)/f(0)=1
a*b*racadabra–f(1)/(f(1)+1)
ab*r*acadabra–f(2)/(f(2)+2)
abr*a*cadabra–1/(f(3)+3)
abra*c*adabra–f(3)/(f(3)+4)
abrac*a*dabra–2/(f(4)+5)
abraca*d*abra–f(4)/(f(4)+6)
abracad*a*bra–3/(f(5)+7)
abracada*b*ra–1/(f(5)+8)
abracadab*r*a–1/(f(5)+9)
abracadabr*a*–4/(f(5)+10)

To minimize the number of bits, we'd need to maximize the sum f(1)/(f(1)+1)+f(2)/(f(2)+2)+1/(f(3)+3)+f(3)/(f(3)+4)+2/(f(4)+5)+f(4)/(f(4)+6)+3/(f(5)+7)+1/(f(5)+8)+1/(f(5)+9)+4/(f(5)+10). Maximizing this sum depends on the precise details of the function f(x) used.

According to one embodiment, a look-up table may be provided for various f(x). Maximizing the sum would then be equivalent to maximizing each of the expressions f(1)/(f(1)+1), f(2)/(f(2)+2), 1/(f(3)+3)+f(3)/(f(3)+4), 2/(f(4)+5)+f(4)/(f(4)+6), and 3/(f(5)+7)+1/(f(5)+8)+1/(f(5)+9)+4/(f(5)+10), subject to certain constraints, such as, for example that f(x) is an integer greater than or equal to 1. Furthermore, for implementations that try to be space conserving and only use a single byte for counts, f(x) may well have an upper limit of 255. Also, the constraint that the sequence {f(x)} be monotonically non-increasing will make a few things simpler. The restriction that f(x) always be greater than or equal to 1 is actually dependent on the type of coder being used: if you are using a bit-granular coding, you can get away with having f(256)=0 (assuming you are coding bytes).

However, for fractional bit coding methods (range or arithmetic coding), one may almost certainly need to code an end-of-stream (EOS) code, which will require an escape to code. For the purpose of illustration, the end-of-stream code is omitted in the following discussion.

In one embodiment, the values that maximize the sum with the constraints given above are f(1)=255, f(2)=255, f(3)=3, f(4)=3, and f(5)=1. This would result in a theoretical minimum bit count of 17 bits. This table of escape counts could be prepended to the compressed data stream. Coding for these values is possible using as low as 45 bits for this example.

According to an alternative embodiment, another way is to model the various f(x) values with a parameterized function family, and pass the parameters as part of the output data stream. For example, if we were to use a parameterized function of the form f(x)=a*x+b, we could use a=–252, b=759 as the parameters, yielding the sequence 507, 255, 3, –249, –501 (constrained to 255, 255, 3, 1, 1)—using a range coder, this would require 18 bits to code.

Representing the parameters can be done in a compact form, if we constrain the absolute value of the parameters to be in the range 1-65536, and realize that the parameter "a" will always be negative. We would need 4 bits to encode the number of bits in each parameter, and for this case, 10 bits for each parameter value, or 24 bits total, for a combined compressed stream length of 42 bits.

Alternatively, other functions might provide better modeling. For example, the function $f(x)=-126x^2+378x+3$ yields f(1)=255, f(2)=255, f(3)=3, f(4)=–501, f(5)=–1257. Replacing f(4) and f(5) with 1 to satisfy the constraints, we are able to model the optimum sequence fairly accurately (only f(4) is off). A range encoder would generate 18 bits to encode this. Representing the parameters, however would take 31 bits, using the coding technique explained in the last paragraph, and the additional constraints that "a" is always negative, and "b" and "c" are always positive.

If we can constrain "c" to 1-256, we could save one bit. The total generated size would be 48 bits—more than our current minimum, but not by much. One last function that may be utilized is an exponentially decaying distribution function with an early peak, such as a scaled Poisson distribution:

$$1 f(k)=(s*a^k*e^{-a})/k!$$

In this function, "s" and "a" are the parameters. The "e" in the expression is the base of the natural logarithm. For the above example, using the parameters a=1 and s=695 (and still constraining the outputs to the integers 1-255, dropping fractional results), we would have the sequence of values f(1)=255, f(2)=127, f(3)=42, f(4)=10, f(5)=2. A range coder would require 20 bits to code our example. The constraints on the parameters would most likely limit "a" to the range 1-128, and "s" to 1-65536. The example parameters would require 18 bits to code. The total coded stream length would be 38 bits.

Figure 7:
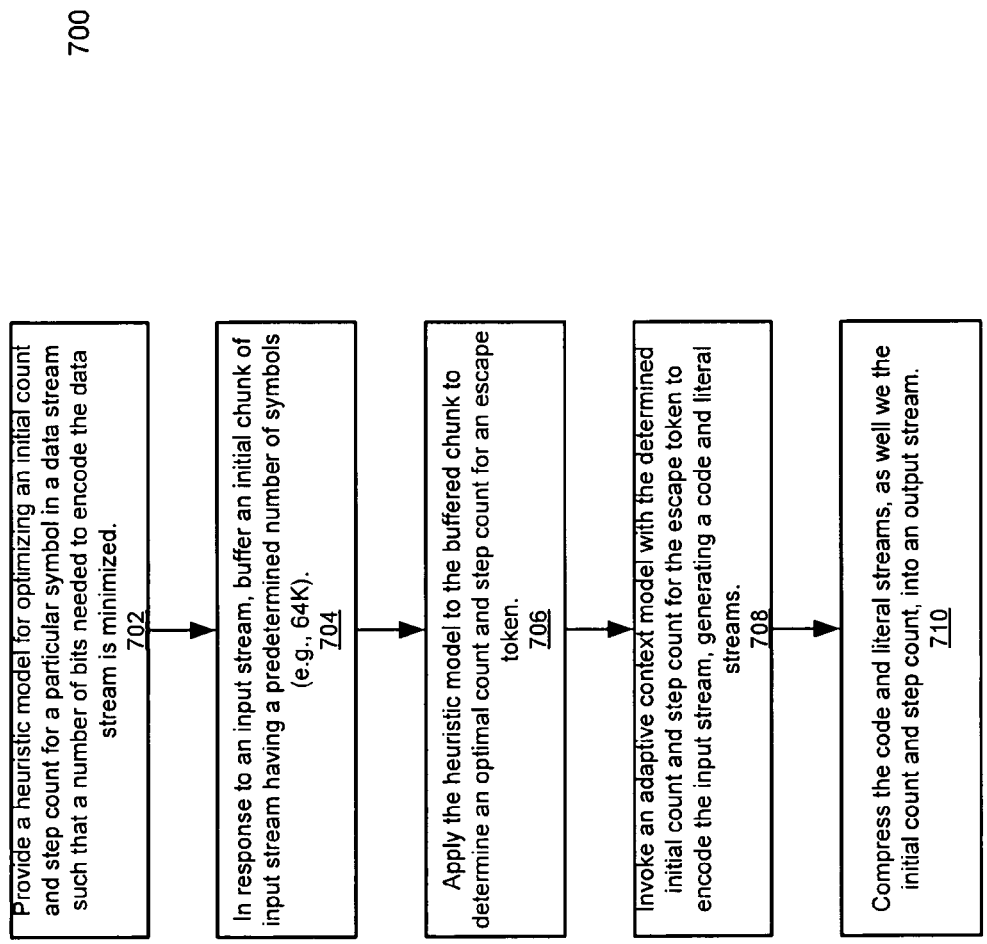
FIG. 7 is a flow diagram illustrating a process for heuristic modeling of adaptive compression escape sequence according to one embodiment of the invention.

FIG. 7 is a flow diagram illustrating a process for encoding data using a heuristic model according to one embodiment of the invention. Note that process 700 may be performed by processing logic which may include software, hardware, or a combination of both. Referring to FIG. 7, at block 702, a heuristic model or function is created for predict or optimize an initial count and step count of a particular symbol or literal (e.g., escape token) in a data stream, such that a number of bits needed to encode the data stream are minimized. At block 704, in response to an input stream an initial chunk of input stream (e.g., initial 64K chunk) is buffered. At block 706, the heuristic model function is applied to the buffered chunk of symbols to determine an optimum initial escape token count for each stage of encoding. Once the initial escape token counts are determined, at block 708, an adaptive context model is invoked to encode the input stream using the adaptive context modeling techniques set forth above, where each context is initialized with the corresponding initial escape token count and the step count. At block 710, the encoded literal and code stream, as well as the information regarding the optimum escape token count and step count for each stage of encoding, are compressed by a variety of compressors into an output stream, which will be decoded by a decoder at a receiving end.

Figure 8:
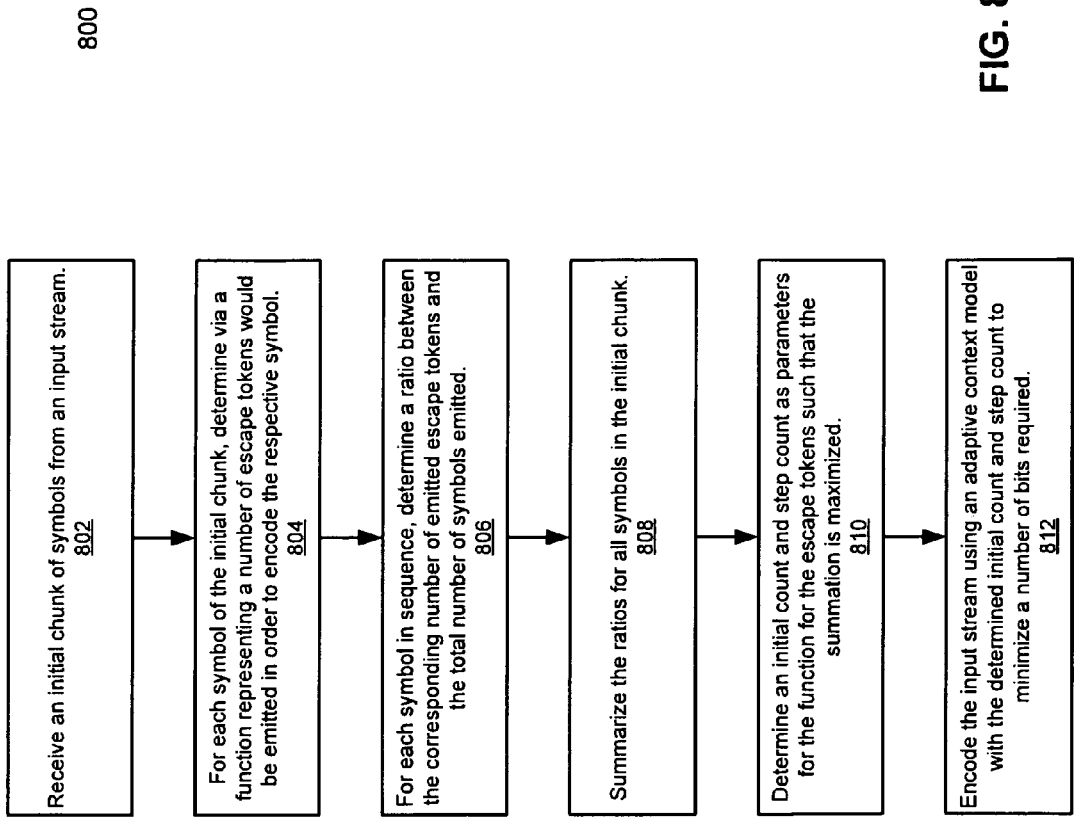
FIG. 8 is a flow diagram illustrating a process for heuristic modeling of adaptive compression escape sequence according to another embodiment of the invention.

FIG. 8 is a flow diagram illustrating a heuristic modeling process to predict an optimum escape token count according to one embodiment of the invention. Process 800 can be performed by processing logic, which may be implemented in software, hardware, or a combination of both. Referring to FIG. 8, at block 802, an initial chunk of input stream is received (e.g., 64K in size). At block 804, for each symbol in the initial chunk, processing logic determines via a function representing a number of escape tokens that would be emitted in order to encode the respective symbol. At block 806, for each symbol in sequence, processing logic determines a ratio between the corresponding number of emitted escape tokens and total number of symbols emitted. At block 806, the determined ratios of all symbols in the initial chunk are summarized. At block 810, processing logic determines the initial count and step count for escape tokens as parameters for the function such that the summation is maximized. Thereafter, at block 812, an input stream is encoded using a context model with the determined initial count and step count to minimize the number of bits needed to encode the input stream. Other operations may also be performed.

Figure 9:
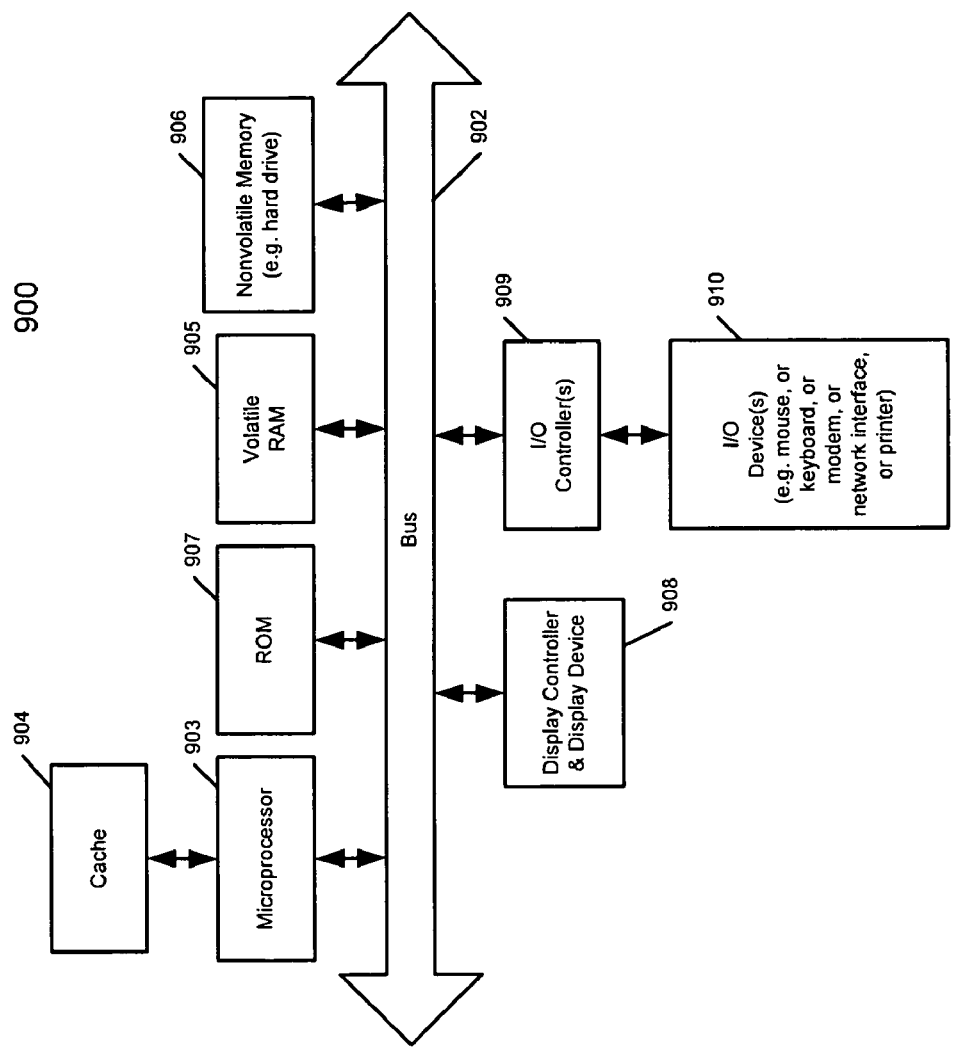
FIG. 9 is a block diagram illustrating an example of a data process system which may be used with one embodiment of the invention.

FIG. 9 illustrates a diagrammatic representation of a machine in the exemplary form of a computer system within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. For example, the system 900 may be used as part of system, either an encoder or a decoder, to perform the coding processes set forth above.

As shown in FIG. 9, the system 900, which is a form of a data processing system, includes a bus or interconnect 902 which is coupled to one or more microprocessors 903 and a ROM 907, a volatile RAM 905, and a non-volatile memory 906. The microprocessor 903 is coupled to cache memory 904 as shown in the example of FIG. 9. Processor 903 may be, for example, a PowerPC microprocessor or an Intel compatible processor. Alternatively, processor 903 may be a digital signal processor or processing unit of any type of architecture, such as an ASIC (Application-Specific Integrated Circuit), a CISC (Complex Instruction Set Computing), RISC (Reduced Instruction Set Computing), VLIW (Very Long Instruction Word), or hybrid architecture, although any appropriate processor may be used.

The bus 902 interconnects these various components together and also interconnects these components 903, 907, 905, and 906 to a display controller and display device 908, as well as to input/output (I/O) devices 910, which may be mice, keyboards, modems, network interfaces, printers, and other devices which are well-known in the art.

Typically, the input/output devices 910 are coupled to the system through input/output controllers 909. The volatile RAM 905 is typically implemented as dynamic RAM (DRAM) which requires power continuously in order to refresh or maintain the data in the memory. The non-volatile memory 906 is typically a magnetic hard drive, a magnetic optical drive, an optical drive, or a DVD RAM or other type of memory system which maintains data even after power is removed from the system. Typically, the non-volatile memory will also be a random access memory, although this is not required.

While FIG. 9 shows that the non-volatile memory is a local device coupled directly to the rest of the components in the data processing system, embodiments of the present invention may utilize a non-volatile memory which is remote from the system; such as, a network storage device which is coupled to the data processing system through a network interface such as a modem or Ethernet interface. The bus 902 may include one or more buses connected to each other through various bridges, controllers, and/or adapters, as is well-known in the art. In one embodiment, the I/O controller 909 includes a USB (Universal Serial Bus) adapter for controlling USB peripherals. Alternatively, I/O controller 909 may include an IEEE-1394 adapter, also known as FireWire adapter, for controlling FireWire devices.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A computer implemented method for encoding data, the method comprising:
   in response to an input stream having a plurality of symbols in sequence, buffering an initial chunk of symbols;
   determining a number of escape tokens that would be emitted at each stage of encoding at least buffered initial chunk;
   for each stage, determining a base value and a step value for the escape token using a heuristic modeling function in view of the determined number of escape tokens such that a number of bits required to encode the input stream is minimized; and
   encoding the input stream using an adaptive context model having a context for each stage to generate an output stream, wherein each context is initialized with the corresponding base value and step value generated from the heuristic modeling function, and wherein the output stream includes the base value and step value for each stage.

2. The method of claim 1, wherein determining a base value and a step value for the escape token using a heuristic modeling function comprises:
   for each stage, determining a probability of an escape token would be emitted during the respective stage; and
   maximizing the probability by adjusting different base values and step values as an input to the heuristic modeling function.

3. The method of claim 2, further comprising calculating a ratio of an output from the heuristic modeling function in view of the output of the heuristic modeling function plus a number of symbols that have been encoded at a particular stage in order to determine the probability.

4. The method of claim 3, further comprising summarizing the ratios for each of the symbols in the initial chunk, wherein maximizing the probability is performed based on maximizing the summary of the ratios for each of the symbols.

5. The method of claim 1, wherein each stage corresponds to encoding each symbol in sequence in the initial chunk.

6. The method of claim 1, wherein encoding the input stream comprises:
   initializing a current context to have an initial count of an escape token equals to the base value corresponding to the current context;
   in response to a symbol retrieved from an input stream, emitting an escape token if the current context cannot encode the symbol; and
   incrementing by a step value corresponding to the current context a count of the escape token in the current context based on the base value.

7. The method of claim 6, further comprising sorting content of the current context based on a value of each entry.

8. A computer readable medium including instructions that, when executed by a processing system, cause the processing system to perform a method for encoding data, the method comprising:
   in response to an input stream having a plurality of symbols in sequence, buffering an initial chunk of symbols;
   determining a number of escape tokens that would be emitted at each stage of encoding at least buffered initial chunk;
   for each stage, determining a base value and a step value for the escape token using a heuristic modeling function in view of the determined number of escape tokens such that a number of bits required to encode the input stream is minimized; and
   encoding the input stream using an adaptive context model having a context for each stage to generate an output stream, wherein each context is initialized with the corresponding base value and step value generated from the heuristic modeling function, and wherein the output stream includes the base value and step value for each stage.

9. The computer readable medium of claim 8, wherein determining a base value and a step value for the escape token using a heuristic modeling function comprises:
   for each stage, determining a probability of an escape token would be emitted during the respective stage; and
   maximizing the probability by adjusting different base values and step values as an input to the heuristic modeling function.

10. The computer readable medium of claim 9, wherein the method further comprises calculating a ratio of an output from the heuristic modeling function in view of the output of the heuristic modeling function plus a number of symbols that have been encoded at a particular stage in order to determine the probability.

11. The computer readable medium of claim 10, wherein the method further comprises summarizing the ratios for each of the symbols in the initial chunk, wherein maximizing the probability is performed based on maximizing the summary of the ratios for each of the symbols.

12. The computer readable medium of claim 8, wherein each stage corresponds to encoding each symbol in sequence in the initial chunk.

13. The computer readable medium of claim 8, wherein encoding the input stream comprises:
   initializing a current context to have an initial count of an escape token equals to the base value corresponding to the current context;
   in response to a symbol retrieved from an input stream, emitting an escape token if the current context cannot encode the symbol; and
   incrementing by a step value corresponding to the current context a count of the escape token in the current context based on the base value.

14. The computer readable medium of claim 13, wherein the method further comprises sorting content of the current context based on a value of each entry.

15. A computer implemented method for decoding data, the method comprising:
   in response to an input stream received from an encoder, extracting a base value and a step value for an escape token for each stage of decoding the input stream, wherein the base value and the step value are determined by the encoder using a heuristic modeling function based on an initial chunk of a sequence symbols, which are encoded in the input stream by the encoder, such that a number of bits used to encode the input stream is minimized;
   initializing each context during each stage of decoding the input stream using the base value and step value for the escape token associated with each context; and
   invoking an adaptive context model to decode the input stream to recover the encoded symbols from the input stream using the initialized contexts.

16. The method of claim 15, wherein invoking an adaptive context model to decode the input stream comprises:

initializing a current context using a base value and a step value of an escape token corresponding to the current context;

consuming a code from a code stream extracted from the input stream;

if the consumed code corresponds to an escape token, emitting a literal from a literal stream extracted from the input stream to an output stream; and updating an entry corresponding to the escape token in the current context by incrementing an count of the escape token by the step value.

17. A computer readable medium including instructions that, when executed by a processing system, cause the processing system to perform a method for decoding data, the method comprising:

in response to an input stream received from an encoder, extracting a base value and a step value for an escape token for each stage of decoding the input stream, wherein the base value and the step value are determined by the encoder using a heuristic modeling function based on an initial chunk of a sequence symbols, which are encoded in the input stream by the encoder, such that a number of bits used to encode the input stream is minimized;

initializing each context during each stage of decoding the input stream using the base value and step value for the escape token associated with each context; and invoking an adaptive context model to decode the input stream to recover the encoded symbols from the input stream using the initialized contexts.

18. The computer readable medium of claim 17, wherein invoking an adaptive context model to decode the input stream comprises:

initializing a current context using a base value and a step value of an escape token corresponding to the current context;

consuming a code from a code stream extracted from the input stream;

if the consumed code corresponds to an escape token, emitting a literal from a literal stream extracted from the input stream to an output stream; and updating an entry corresponding to the escape token in the current context by incrementing an count of the escape token by the step value.

* * * * *